United States Patent [19]

Neilson

[11] 4,156,248

[45] May 22, 1979

[54] GATE TURN-OFF SEMICONDUCTOR CONTROLLED RECTIFIER DEVICE WITH HIGHLY DOPED BUFFER REGION PORTION

[75] Inventor: John M. S. Neilson, Mountaintop, Pa.

[73] Assignee: RCA Corporation, New York, N.Y.

[21] Appl. No.: 823,337

[22] Filed: Aug. 10, 1977

[30] Foreign Application Priority Data

Jan. 31, 1977 [GB] United Kingdom ............... 03919/77

[51] Int. Cl.² ............................................. H01L 29/74
[52] U.S. Cl. ....................................... 357/38; 357/20; 357/55; 357/89
[58] Field of Search ....................... 357/38, 39, 89, 20, 357/55

[56] References Cited

U.S. PATENT DOCUMENTS

| | | | |
|---|---|---|---|
| 3,239,728 | 3/1966 | Aldrich et al. | 357/38 |
| 3,324,359 | 6/1967 | Gentry | 357/38 |
| 3,341,380 | 9/1967 | Mets et al. | 357/38 |
| 3,693,054 | 9/1972 | Anderson | 357/38 |
| 3,774,085 | 11/1973 | Platzoeder et al. | 357/38 |
| 3,855,611 | 12/1974 | Neilson et al. | 357/38 |
| 3,943,549 | 3/1976 | Jaecklin et al. | 357/38 |

FOREIGN PATENT DOCUMENTS

| | | | |
|---|---|---|---|
| 45199 | 1/1966 | German Democratic Rep. | 357/38 |
| 2232916 | 12/1973 | Fed. Rep. of Germany | 357/38 |

*Primary Examiner*—Joseph E. Clawson, Jr.
*Attorney, Agent, or Firm*—H. Christoffersen; R. A. Hays

[57] ABSTRACT

A gate turn-off silicon controlled rectifier comprises a four-layer regenerative portion and a four-layer buffer portion having reduced regenerative capability. The buffer portion is positioned such that when a turn-off pulse is applied to the device it is the last portion which conducts current.

3 Claims, 2 Drawing Figures

GATE TURN-OFF SEMICONDUCTOR CONTROLLED RECTIFIER DEVICE WITH HIGHLY DOPED BUFFER REGION PORTION

The present invention relates generally to semiconductor devices and, in particular, relates to gate turn-off silicon controlled rectifiers.

Silicon controlled rectifiers (SCRs) are generally four-layer semiconductor devices having two operational states, that is a high impedance, or blocking, state and a low impedance, or conducting, state. While most SCRs are capable of being switched from the high impedance state to the low impedance state, it is desirable to also have the capability of switching such a device from the low impedance state to a high impedance state. Such devices are conventionally known as gate turn-off (GTO) devices and usually require a relatively large voltage to effectively switch the device from the conducting state to the blocking state.

Another characteristic of a GTO/SCR is, that during turn-off, the conducting current, i.e., plasma, is generally forced into a dense filament before it is extinguished. Such a high current density filament is usually accompanied by relatively high temperatures and the combination of these factors can generally damage or destroy a device. In addition, such a high current density filament is not easily extinguished.

One method of turning off an SCR is to provide a non-regenerative section adjacent the regenerative SCR section. While somewhat effective, this type of device is usually hampered by the need for a large lateral current within the device to switch it from the blocking state to the conducting state.

A gate turn-off device embodying the principles of the present invention comprises a regenerative SCR section and, remote from a gate electrode thereof, a buffer section which has reduced regenerative characteristics.

Figure 1:
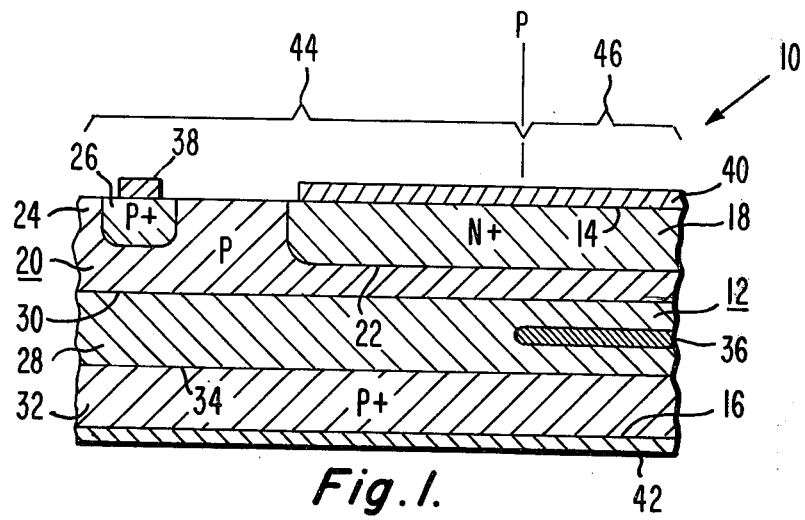
FIG. 1 is a cross-sectional view of a device, not drawn to scale, embodying principles of the present invention.

A first embodiment device, indicated generally at 10 in FIG. 1 comprises a body 12 of semiconductor material, for example silicon, having first and second major opposing surfaces, 14 and 16 respectively. A first region 18 having a first type conductivity, for example N type, is within the body 12 and adjacent the first major surface 14. While the first region 18 has been shown as having an N-type conductivity it can also be made to have a P type conductivity so long as all other conductivity types mentioned hereinafter are likewise changed.

A second region 20 having a second type conductivity is within the body 12 adjacent the first region 18 and forms a first PN junction 22 at the interface therewith. Preferably, the second region 20 has a portion 24 which extends to the first major surface 14. The portion 24 may contain a pocket 26 which, while having the second type conductivity, has a comparatively higher carrier concentration than the second region 20.

A third region 28 having the first type conductivity, is within the body 12 adjacent the second region 20 and spaced apart from the first region 18 thereby. A second PN junction 30 exists at the interface between the third region 28 and the second region 20.

A fourth region 32 having the second type conductivity is adjacent the third region 28 and extends to the second major surface 16. A third PN junction 34 is formed at the interface between the fourth region 32 and the third region 28.

A fifth region 36 having the first type conductivity is entirely within the third region 28 and is located remotely from the pocket 26 but is vertically aligned with a portion of the first region 18. The fifth region 36 has the first type conductivity but has a comparatively higher conductivity concentration than the third region 28. Preferably, the fifth region 36 is spaced apart from the second and third PN junctions, 30 and 34 respectively, by material of the third region 28.

First electrode means 38 overlies and electrically contacts the pocket 26. Second electrode means 40 overlies and electrically contacts the first region 18 and extends over substantially all of the first region 18 including that portion thereof which is vertically aligned with the fifth region 36. Third electrode means 42 overlies and electrically contacts the fourth region 32.

For ease of understanding, the device 10 described above can be considered to be comprised of a regenerative SCR section 44 and a buffer section 46. The division between the regenerative SCR section 44 and the buffer section 46 is at a plane P which is substantially perpendicular to the first and second major surfaces, 14 and 16 respectively, and passes through the innermost extent of the fifth region 36. That is, it passes through the end of the fifth region 36 which is most proximate the pocket 26. The buffer section 46 therefore is substantially comprised of the lateral extensions of the cathode, active gate, base and anode regions, 18, 20, 28 and 32 respectively. For a specific example, the first region 18 preferably has a carrier concentration on the order of about $10^{19}$ atoms/cm$^3$ and the part of the first region within the regenerative SCR section 44 can be considered a cathode region thereof. The second region 20 preferably has a carrier concentration on the order of about $10^{16}$ atoms/cm$^3$ and can be considered as an active gate region within the regenerative SCR section 44. The pocket 26 operationally functions as a gate contact pocket and may have a carrier concentration on the order of about $10^{19}$ atoms/cm$^3$. The third region 28 which is functionally considered a base region within the regenerative SCR section 44, preferably has a carrier concentration on the order of about $10^{14}$ atoms/cm$^3$. In this example, the fourth region 32 operates as an anode region in the section 44 and may have a carrier concentration on the order of about $10^{19}$ atoms/cm$^3$. The fifth region 36 which is completely within the buffer section 46 of the device 10 operates as, as more fully discussed below, an alpha reducing means.

Since the device 10, as described, operates similarly to other known SCR devices when being switched from the blocking state to the conducting state, only the turn-off mode of operation is described hereinafter.

It is assumed for the following discussion that the second electrode means 40 is at a ground potential and the third electrode means 42 is positive with respect thereto. Further, it is assumed that the device 10 is in the conducting state. Thus, a current plasma flows between the fourth region 32 and the first region 18 in the usual fashion.

When a negative potential, with respect to the ground potential, is applied to the first electrode means 38, the current plasma is repelled away from the pocket 26 toward the buffer section 46. The buffer section 46 which has been conducting, but to a lesser extent than the regenerative SCR section 44, during the "on" state, continues to conduct and absorb substantially all of the current plasma forced from the regenerative SCR section 44. However, due to the presence of the fifth region 36, the buffer section 46 does not regenerate holes in sufficient quantity to maintain the device 10 in its fully "on" state. The reason for this can be best understood by a brief discussion of an analog of an SCR device.

An SCR can be considered as two complementary overlapping transistors, i.e., an NPN transistor and a PNP transistor having overlapping base and collector regions. That is, the collector of the PNP serves as the base for the NPN and vice-versa. It is also known that, in order to maintain regeneration, the sum of the alphas of the transistors must be equal to or greater than unity. It is also known that the alpha of a given transistor is directly proportional to the base transport factor of that transistor. The base transport factor, as known in the art, is inversely dependent on the base conductivity, for example, in general, if the base conductivity is increased, the base transport factor is reduced and vice-versa.

In the device 10, due to the presence of the fifth region 36, however, the PNP transistor of the buffer section 46 has a very low base transport factor compared to the corresponding portions of the regenerative SCR section 44. Thus, since the buffer section 46 does not sustain regeneration as does the section 44, the high current density plasma which has been forced from the regenerative SCR section 44 thereinto is reduced and finally extinguished.

Figure 2:
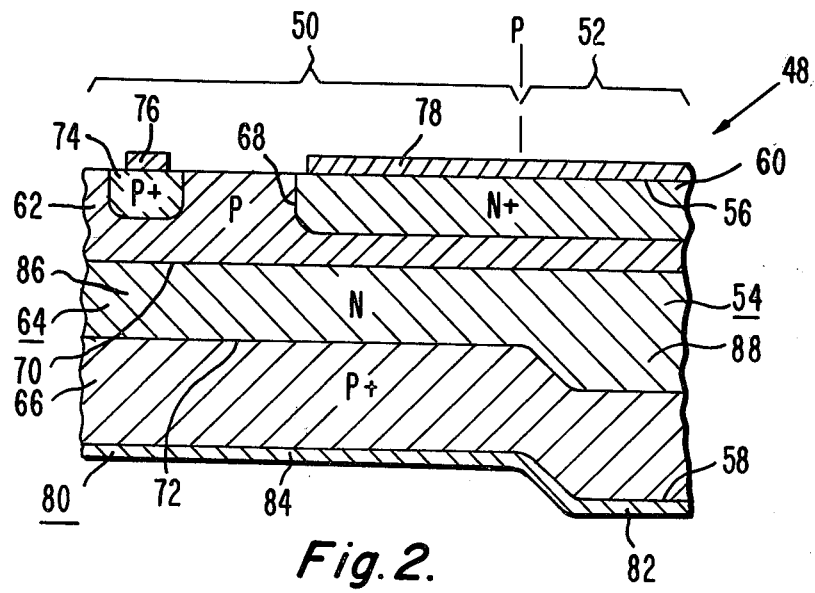
FIG. 2 is a cross-sectional view of a second embodiment device, not drawn to scale, also embodying the principles of the present invention.

A second embodiment device indicated generally at 48 in FIG. 2, also has a regenerative SCR section 50 and a buffer section 52. Similar to the first embodiment device 10, the device 48 has a body 54 of semiconductor material having two major opposing surfaces 56 and 58 respectively, and contains a first region 60 having the first type conductivity, a second region 62 having the second type conductivity, a third region 64 having the first type conductivity and a fourth region 66 having the second type conductivity. These regions forming first, second and third PN junctions 68, 70 and 72 respectively, therebetween. Also similarly, the second region 62 contains a pocket 74 adjacent the first major surface 56. Furthermore, the second embodiment device 48 also comprises first, second and third electrode means 76, 78 and 80, respectively, contacting the pocket 74, the first region 60 and the fourth region 66, respectively.

The second major surface 58 has first and second portions 82 and 84 respectively, which are substantially parallel with each other. Preferably, the first portion 82 of the second major surface 58 is within, or vertically a part of, the buffer section 52 and is further away from the first major surface 56 than is the second portion 84 of the second major surface 80 which is a part of the regenerative SCR section 50 of the device 48. In addition, the third region 64 has a comparatively thinner portion 86 and a comparatively thicker portion 88. The comparatively thinner portion 86 is within the regenerative SCR section 50 of the device 48 and the comparatively thicker portion 88 is within the buffer section 52 of the device 48.

Operationally, the regenerative SCR section 50 operates in a similar manner to the regenerative SCR section 44 of the device 10. However, in the device 48, when a negative pulse is applied to the pocket 74 the current plasma is forced into the buffer section 52, i.e., the vertical section containing the comparatively wider portion 88 of the third region 64. In this embodiment, the comparatively wider portion 88 of the third region 64 reduces the base transport factor of the PNP transistor of the buffer section 52 and serves to reduce the regenerative effects therein.

In general, the buffer sections 46 and 52 as described for the devices 10 and 48 provide means for extinguishing the conducting plasma. In addition, the presence of the fifth region 36 in the device 10 and the comparatively thicker portion 88 of the third region 64 in the device 48 provide means for reducing the base transport factor of the PNP transistor which makes up a portion of the buffer section 52.

Devices embodying the principles of the present invention allow SCRs to be switched from the conducting state to the blocking state without the excessive lateral currents usually needed during the turning-on state. Furthermore, since all of the conducting plasma is forced into a buffer section where it continues to conduct, at least until the main regenerative SCR section has been totally voided of the conducting plasma, the possibility of high current density filaments forming is substantially reduced. That is, instead of forming a high current density filament within the buffer section, the current plasma which is forced thereinto is spread over substantially all of the buffer section and simultaneously extinguished therefrom.

What is claimed is:

1. A gate turn-off semiconductor controlled rectifier comprising:
    a cathode region having a one type conductivity adjacent a major surface of a body of semiconductor material, said cathode region extending a lateral distance across said surface;
    an active gate region having a second type conductivity adjacent said cathode region and forming a first PN junction at the interface therewith;
    a base region having said one type conductivity adjacent said active gate region and forming a second PN junction therewith, said base region being spaced apart from said cathode region by said active gate region;
    an anode region having said second type conductivity adjacent said base region and forming a third PN junction at the interface therewith, said anode region being spaced apart from said active gate region by said base region, said anode region also being adjacent another major surface of said body;
    a four-layer buffer section comprising the lateral extensions of said cathode, said active gate, said base and said anode regions; and
    a fifth region having said one type conductivity entirely within said lateral extension of said base region, said fifth region having a comparatively higher carrier concentration than said lateral extension of said base region, said fifth region being spaced apart from said lateral extensions of said active gate region and said anode region.

2. A device as claimed in claim 1 further comprising:
    a pocket having said second type conductivity within said active gate region, said pocket having a comparatively higher carrier concentration than said active gate region.

3. A device as claimed in claim 2 wherein:
    said four-layer buffer section is distal from said pocket.

* * * * *